United States Patent
Yonekawa et al.

(10) Patent No.: US 12,157,150 B2
(45) Date of Patent: Dec. 3, 2024

(54) PARTICLE REMOVAL METHOD, PARTICLE REMOVAL APPARATUS, AND METHOD FOR MANUFACTURING ARTICLE

(71) Applicant: CANON KABUSHIKI KAISHA, Tokyo (JP)

(72) Inventors: Masami Yonekawa, Tochigi (JP); Tomohiro Saito, Tochigi (JP); Hisanobu Azuma, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/054,021

(22) Filed: Nov. 9, 2022

(65) Prior Publication Data
US 2023/0149982 A1    May 18, 2023

(30) Foreign Application Priority Data

Nov. 12, 2021 (JP) .................................. 2021-184898
Jun. 20, 2022 (JP) .................................. 2022-099156

(51) Int. Cl.
*B08B 7/00* (2006.01)
*B08B 11/00* (2006.01)
*G03F 7/00* (2006.01)

(52) U.S. Cl.
CPC .......... *B08B 7/0028* (2013.01); *B08B 7/0014* (2013.01); *B08B 11/00* (2013.01); *G03F 7/0002* (2013.01)

(58) Field of Classification Search
None
See application file for complete search history.

(56) References Cited

U.S. PATENT DOCUMENTS

| | | | | |
|---|---|---|---|---|
| 2004/0137739 | A1* | 7/2004 | Korthuis | ............... B24B 53/017 |
| | | | | 438/692 |
| 2015/0336305 | A1* | 11/2015 | Kurosawa | ............. B82Y 40/00 |
| | | | | 425/145 |
| 2019/0178468 | A1* | 6/2019 | Miyazaki | ............. G02B 5/1847 |

FOREIGN PATENT DOCUMENTS

| | | |
|---|---|---|
| JP | 2012243805 A | 12/2012 |
| JP | 2016072517 | * 5/2016 |

OTHER PUBLICATIONS

Translation of JP2016072517 by Matsushima, published May 9, 2016.*

* cited by examiner

*Primary Examiner* — Mikhail Kornakov
*Assistant Examiner* — Ryan L Coleman
(74) *Attorney, Agent, or Firm* — Canon U.S.A., Inc. I.P. Division

(57) ABSTRACT

A curable composition on a substrate is cured in a state where a member is in contact with the curable composition. Thereafter, the member having adhered to the curable composition is separated from the substrate, whereby the curable composition and a particle are removed from the substrate.

13 Claims, 12 Drawing Sheets

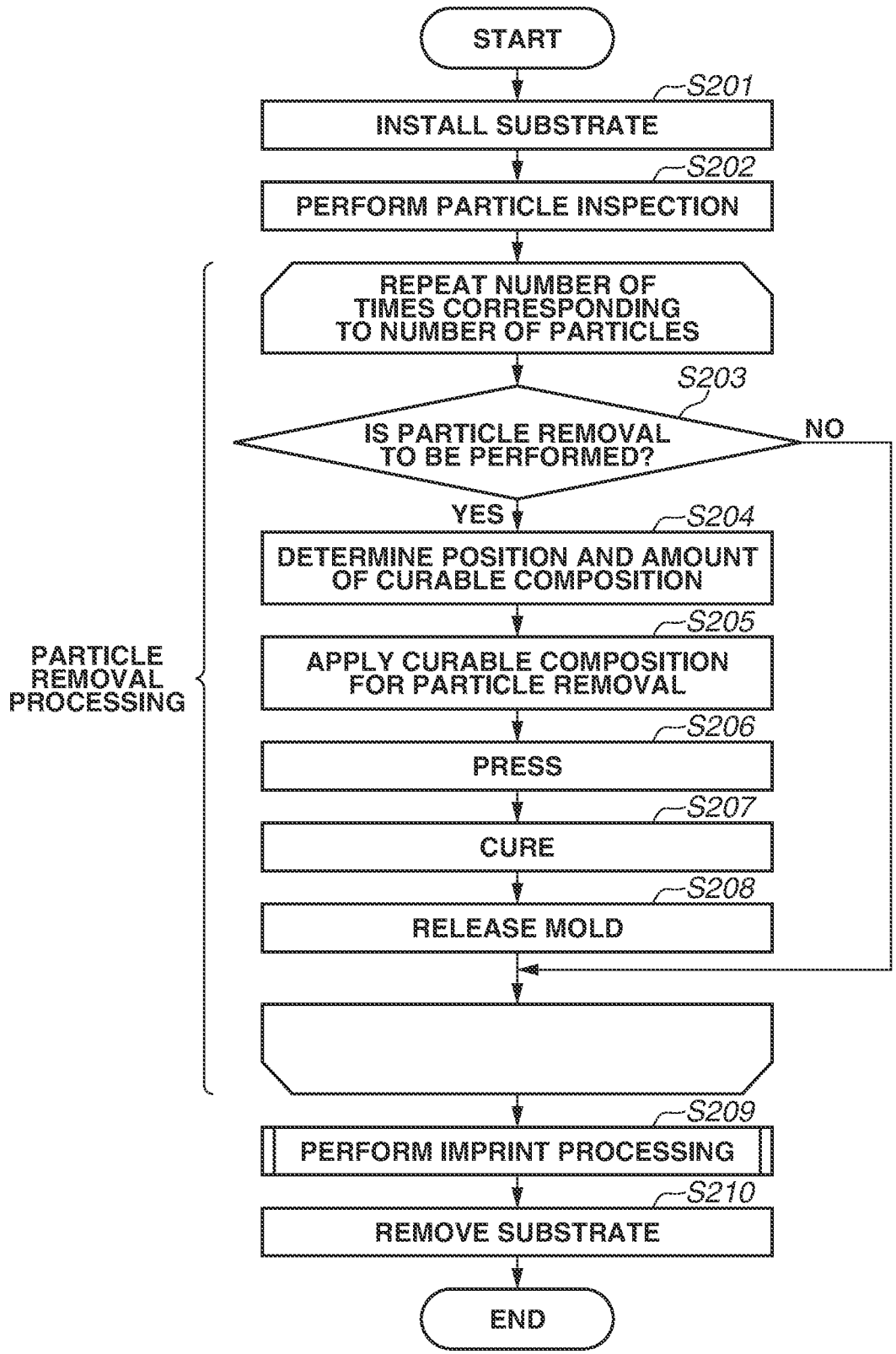

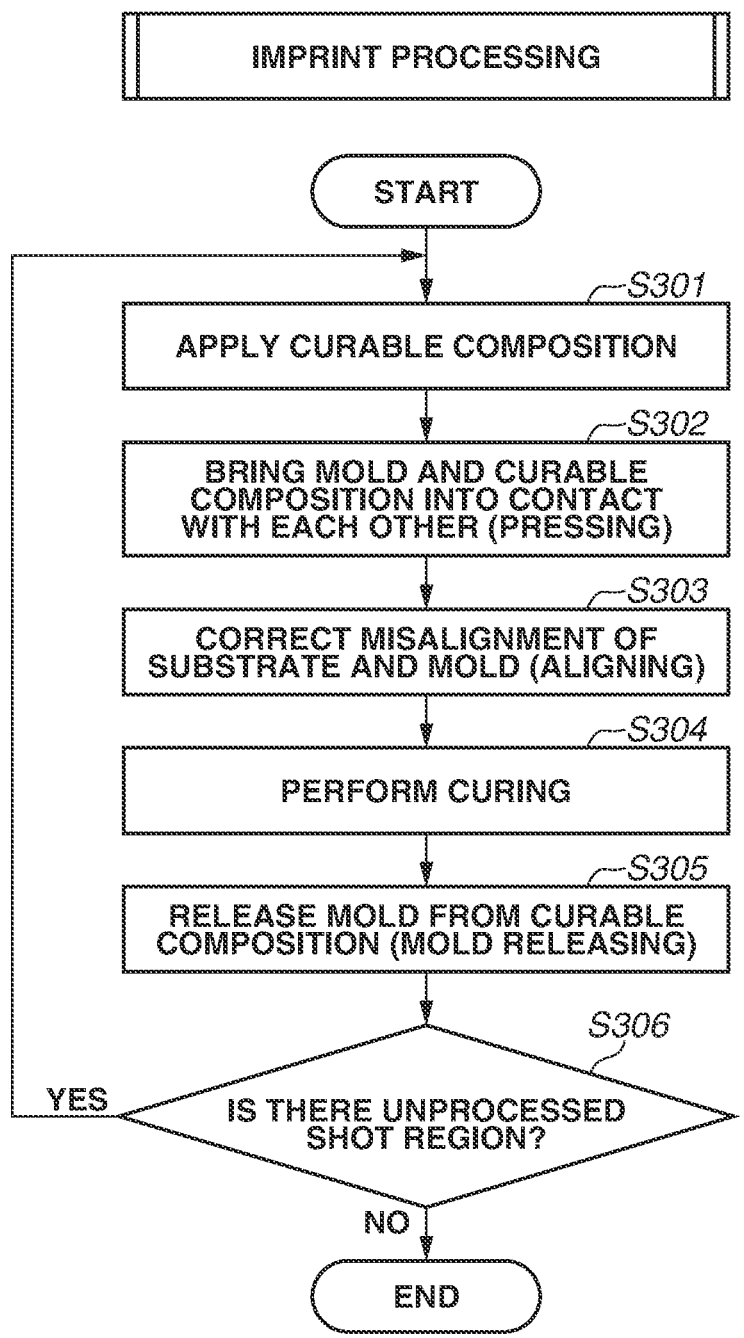

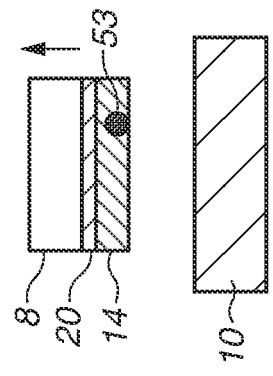
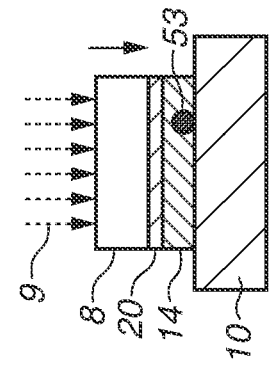
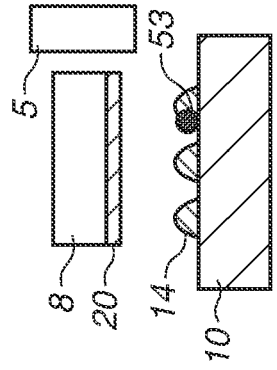
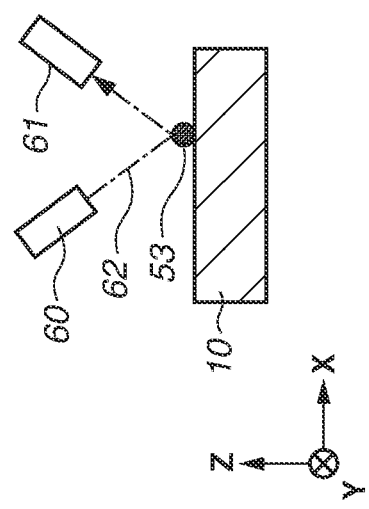
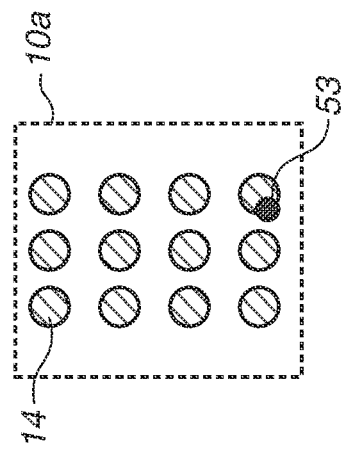
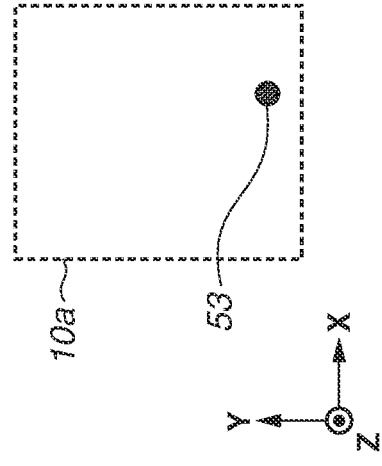

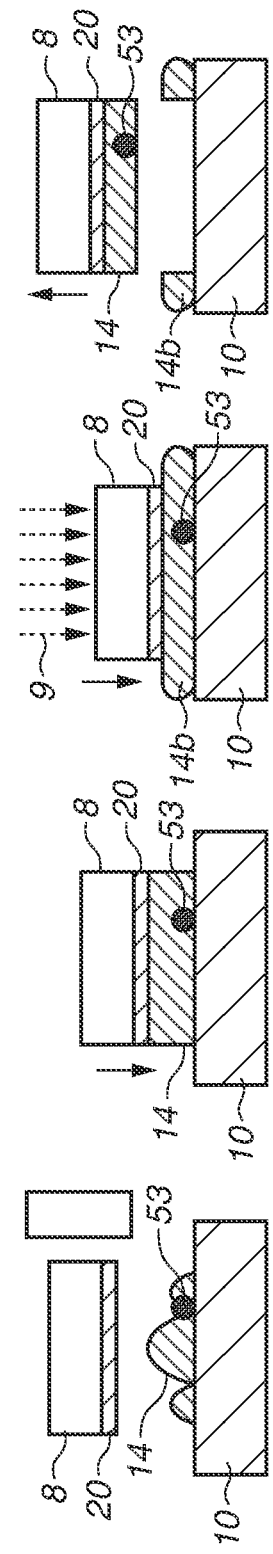
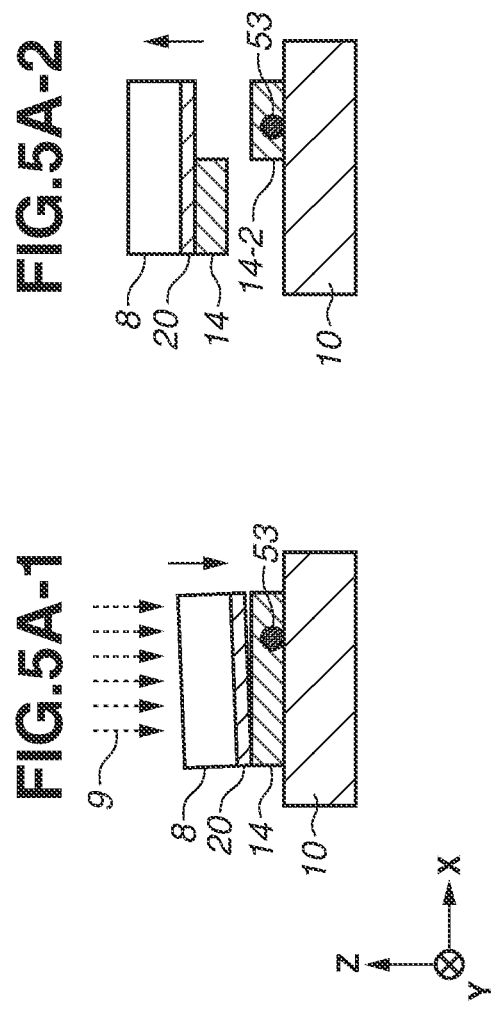

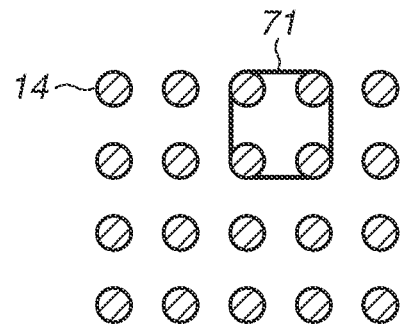
FIG.6A
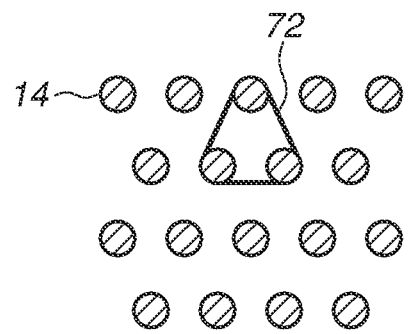
FIG.6B
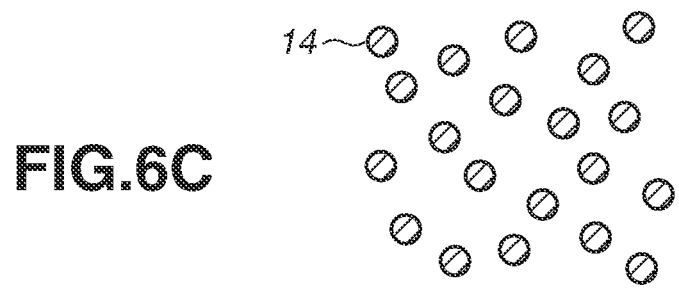
FIG.6C
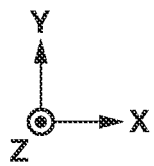

FIG.8A
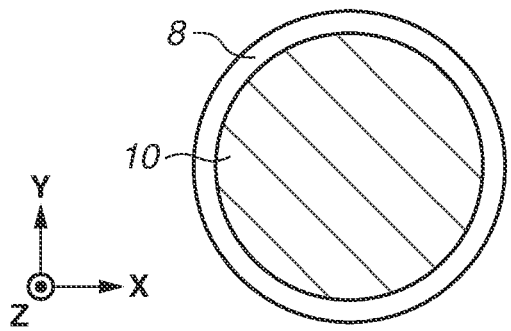
FIG.8B-1
FIG.8B-2
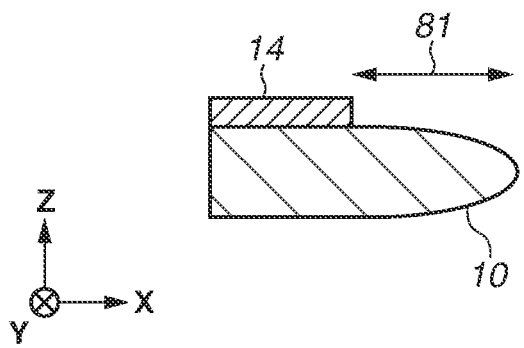 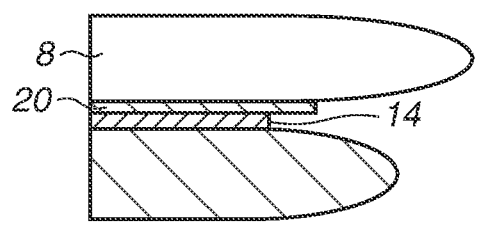
FIG.8C-1
FIG.8C-2
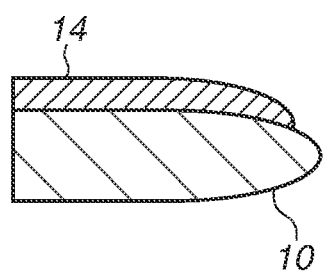 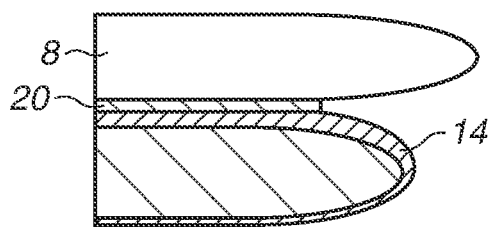

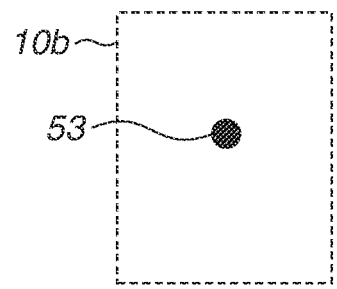
FIG.9A
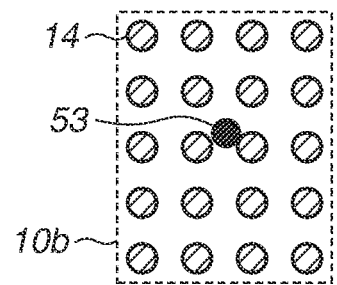
FIG.9B
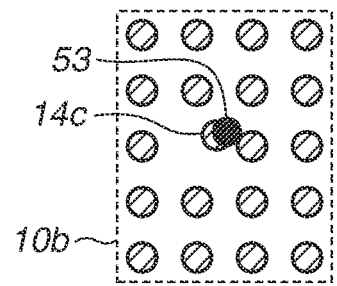
FIG.9C
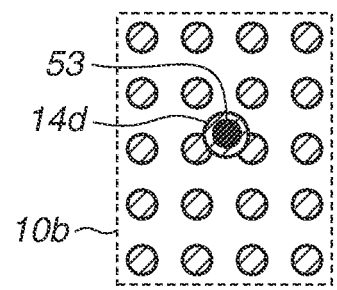
FIG.9D
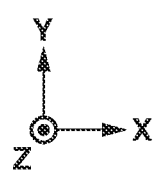

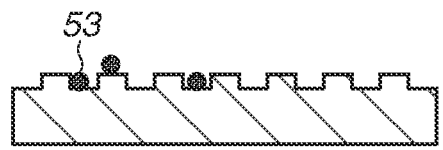
FIG.12A
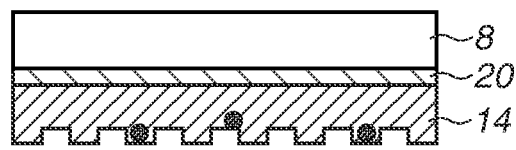
FIG.12B
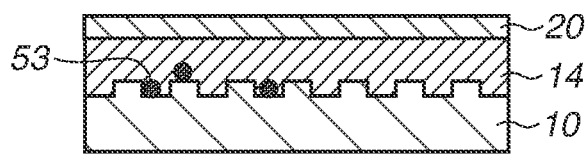
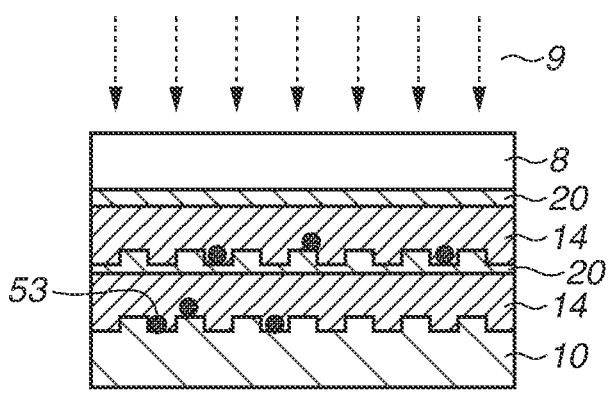
FIG.12C
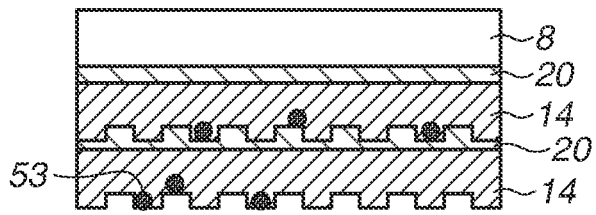
FIG.12D

… (1)

PARTICLE REMOVAL METHOD, PARTICLE REMOVAL APPARATUS, AND METHOD FOR MANUFACTURING ARTICLE

BACKGROUND OF THE INVENTION

Field of the Invention

The present disclosure relates to a particle removal method, a particle removal apparatus, and a method for manufacturing an article.

Description of the Related Art

There are increasing demands for microfabrication of semiconductor devices and micro-electromechanical systems (MEMS), and imprint techniques for forming several nanometer scale fine patterns (structures) on substrates have drawn attention besides conventional photolithography techniques. The imprint techniques are microfabrication techniques that supply (apply) an uncured imprint material on a substrate, bring the imprint material and a mold into contact with each other, and form a pattern of the imprint material corresponding to a pattern of fine depressions and protrusions formed on the mold on the substrate.

One of the methods for curing an imprint material in the imprint techniques is a light curing method. The light curing method is a method of curing an imprint material by exposing the imprint material to light, the imprint material of which is supplied to a shot region on a substrate and in contact with a mold, and separating the mold from the cured imprint material, which forms a pattern of the imprint material on the substrate.

In the imprint techniques, bringing a mold and an imprint material on a substrate into contact with each other in a state where a particle is on the substrate can result in unsuccessful forming of the structure of a desired shape and also damage the mold and the substrate. Thus, the imprint processing is desirably performed after the particle on the substrate is removed.

Japanese Patent Application Laid-Open No. 2012-243805 discusses a method for removing particles before forming a pattern on a wafer by identifying positions of the particles on the wafer, pulverizing the particles, and bringing a particle removal mold including an adhesive film attached thereto into contact with the pulverized particles to remove the particles.

With the particle removal method discussed in Japanese Patent Application Laid-Open No. 2012-243805, however, component members such as patterns and underground layers can be damaged in pulverizing the particles. Further, when the particles are removed using an adhesive, not all the particles may be removed.

SUMMARY OF THE INVENTION

According to an aspect of the present disclosure, a particle removal method for removing a particle on a substrate includes supplying a curable composition on the substrate, bringing a member into contact with the curable composition on the substrate, curing the curable composition in a state where the curable composition and the member are in contact with each other, and removing the curable composition and the particle from the substrate by separating the member from the substrate. Particle processing including the supplying, the bringing, the curing, and the removing is performed a plurality of times using the same member in such a manner that the cured curable composition is layered on the member.

Further features of the present disclosure will become apparent from the following description of exemplary embodiments with reference to the attached drawings.

BRIEF DESCRIPTION OF THE DRAWINGS

FIG. 2 is a flowchart illustrating a procedure of particle removal processing.

FIG. 3 is a flowchart illustrating a procedure of imprint processing in FIG. 2.

FIGS. 4A to 4F illustrate a procedure of the particle removal processing.

FIGS. 5A-1 to 5B-4 illustrate an example of a failure of the particle removal processing.

FIGS. 6A to 6C illustrate an example of an arrangement of droplets discharged in the particle removal processing.

FIGS. 8A to 8C-2 are diagrams according to an exemplary embodiment of the present disclosure.

FIGS. 9A to 9D are diagrams according to an exemplary embodiment of the present disclosure.

FIGS. 12A to 12D are diagrams according to an exemplary embodiment of the present disclosure.

DESCRIPTION OF THE EMBODIMENTS

Figure 1:
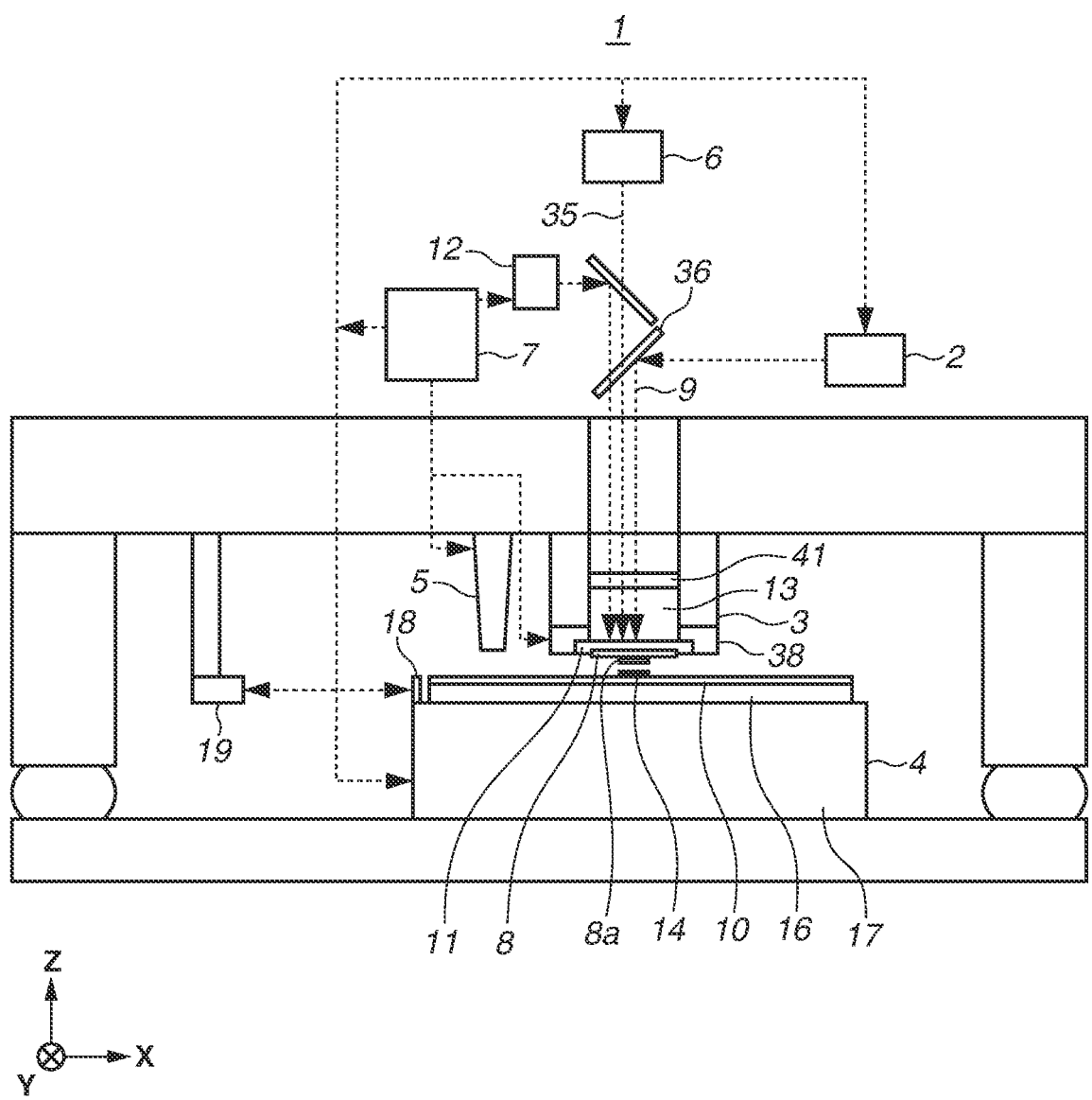
FIG. 1 is a schematic view illustrating the configuration of an imprinting apparatus.

Various exemplary embodiments of the present disclosure will be described below with reference to the attached drawings. In the drawings, like numbers refer to like members, and redundant descriptions thereof will be omitted.

A first exemplary embodiment will be described. An imprinting apparatus is an apparatus that forms a pattern of a cured material to which a pattern of depressions and protrusions of a mold is transferred by bringing a curable composition (imprint material) fed on a substrate into contact with the mold and applying energy for curing to the curable composition. For example, the imprinting apparatus feeds the curable composition on the substrate and cures the curable composition in contact with the mold having the pattern of depressions and protrusions. Then, the distance between the mold and the substrate is increased, and the mold is separated (released) from the cured curable composition, whereby the pattern of the mold is transferred to the curable composition on the substrate. The foregoing series of processing is referred to as "imprint processing" and is performed on each of a plurality of shot regions on the substrate. Specifically, in performing the imprint processing on each of a plurality of shot regions on a single substrate, the imprint processing is repeated the number of times corresponding to the number of shot regions on the single substrate.

FIG. 1 is a view illustrating the configuration of an imprinting apparatus 1. The configuration of the imprinting apparatus 1 will be described with reference to FIG. 1. Axes are determined as illustrated in FIG. 1 so that a substrate 10 is placed on the XY-plane and the Z-direction is perpendicular to the XY-plane. The imprinting apparatus 1 is an apparatus that forms a pattern of a cured material to which a pattern of depressions and protrusions of a mold 8 is transferred by bringing the mold 8 into contact with the curable composition fed on the substrate 10 and applying energy for curing to the curable composition.

The mold 8 is also referred to as "mold", "template", or "original". The imprinting apparatus 1 in FIG. 1 is used in manufacturing devices such as semiconductor devices as articles. The imprinting apparatus 1 that uses a light curing method will be described.

The imprinting apparatus 1 includes a mold holding unit 3 (also referred to as "imprint head" or "member holding unit"), a substrate holding unit 4 (stage), and a discharge mechanism 5 (curable composition supply unit). The mold holding unit 3 holds and moves the mold 8. The substrate holding unit 4 holds and moves the substrate 10. The discharge mechanism 5 places a curable composition on the substrate 10. The imprinting apparatus 1 further includes a light exposure system 2 (curing unit), an image capturing unit 6, and a control unit 7. The light exposure system 2 emits light 9 for curing the curable composition. The image capturing unit 6 emits light 35 and captures an image of a contact state of the mold 8 and the curable composition. The control unit 7 controls operations of the imprinting apparatus 1. The imprinting apparatus 1 further includes a detection device 12. The detection device 12 detects marks formed on the mold 8 and the substrate 10.

The substrate holding unit 4 includes a substrate chuck 16 and a substrate driving mechanism 17. The substrate chuck 16 holds the substrate 10. The substrate driving mechanism 17 controls the position of the substrate 10 in at least X- and Y-axes directions, two axes in an XYZ coordinate system. Further, the substrate holding unit 4 includes, on its side surface, a plurality of reference mirrors 18 corresponding to the X, Y, Z, ωx, ωy, and ωz directions. On the contrary, the imprinting apparatus 1 includes a plurality of laser interferometers 19 (length measurement device). The laser interferometers 19 emit beams to the reference mirrors 18 to thereby measure the position of the substrate holding unit 4. The laser interferometers 19 measure the position of the substrate holding unit 4, and the control unit 7 controls the position of the substrate 10 (the substrate holding unit 4) based on the measurement values. The imprinting apparatus 1 can measure the position of the substrate holding unit 4 using an encoder in place of the reference mirrors 18 and the laser interferometers 19.

The mold holding unit 3 is moved upward and downward (Z-axis direction) by a mold driving mechanism 38 (actuator) provided to the mold holding unit 3 with the mold 8 held by a mold chuck 11. As the mold holding unit 3 is moved downward (−Z direction) by the mold driving mechanism 38, a pattern region 8a of the mold 8 is brought into contact with (is pressed against) a curable composition 14. A reverse pattern of depressions and protrusions pattern to be formed on the substrate 10 is formed on the pattern region 8a of the mold 8 for use in the imprinting apparatus 1.

While a case where a mesa portion of the mold 8 is the pattern region 8a will be described below, the mesa portion can be a flat portion without a formed pattern. After the curable composition 14 is cured, the mold holding unit 3 is moved upward (+Z direction) by the mold driving mechanism 38 to thereby separate (release) the pattern region 8a of the mold 8 from the cured curable composition. In the pressing and the releasing, the substrate holding unit 4 can be moved in the Z-axis direction instead of moving the mold holding unit 3, or the mold holding unit 3 and the substrate holding unit 4 can be moved relatively to each other.

Further, the mold holding unit 3 can have a space 13 separated by a light transmissive member 41 (e.g., quartz plate) and the mold 8, and the mold 8 can be deformed during the pressing or releasing by adjusting the pressure in the space 13. For example, the pressure in the space 13 can be increased during the pressing so that the mold 8 will be deformed into a protrusion shape with respect to the substrate 10, bringing the pattern region 8a into contact with the curable composition 14.

The detection device 12 detects marks formed on the mold 8 and marks formed on the substrate 10. The imprinting apparatus 1 determines relative positions of the mold 8 and the substrate 10 based on results of detection by the detection device 12 and adjusts the positions of the mold 8 and the substrate 10 by moving at least one of the mold 8 or the substrate 10.

The image capturing unit 6 is configured (arranged) to include the pattern region 8a of the mold 8 held by the mold holding unit 3 within the field of view of the image capturing unit 6 and captures an image of at least one of the mold 8 or the substrate 10. The image capturing unit 6 is a camera (spread camera) that observes a contact state of the mold 8 and the curable composition 14 on the substrate 10 and checks the state on the substrate 10.

The control unit 7 includes a central processing unit (CPU) and a memory and controls operations of each mechanism of the imprinting apparatus 1 to form a pattern on the shot regions formed on the substrate 10. Further, the control unit 7 can be configured to control the mold holding unit 3, the substrate holding unit 4, the discharge mechanism 5, the light exposure system 2 (curing unit), the image capturing unit 6, and the detection device 12. The control unit 7 can be provided in the imprinting apparatus 1, or the control unit 7 can be placed in a different place from the imprinting apparatus 1 and can be controlled remotely.

A curable composition (also referred to as "resin in an uncured state") that will be cured by application of energy for curing to the curable composition is used as the curable composition 14. Electromagnetic waves are used as the energy for curing. Examples of electromagnetic waves are light having wavelengths in the range of 10 nm to 1 mm, such as infrared light, visible light, and ultraviolet light.

The curable composition 14 is a composition that will be cured by applying light or by heating. Among the compositions, a light curable composition that will be cured by light contains at least a polymerizable compound and a photopolymerization initiator and can contain a non-polymerizable compound or solvent as appropriate. The non-polymerizable compound is at least one type selected from the group consisting of a sensitizer, a hydrogen donor, an internal mold release agent, a surfactant, an antioxidant, and a polymer component.

The curable composition 14 is applied onto the substrate 10 in the form of droplets or in the form of islands or films formed by a plurality of droplets connected together by a liquid spray head of the discharge mechanism 5 using an inkjet method. The curable composition 14 has a viscosity (viscosity at 25° C.) of, for example, 1 mPa·s or higher and 100 mPa·s or less.

A glass, a ceramic, a metal, a semiconductor, or a resin is used as the substrate 10, and a member made of a material different from that of the substrate 10 can be formed on the surface of the substrate 10 as appropriate. The substrate 10 is specifically a silicon wafer, a compound semiconductor wafer, or a quartz glass.

With the imprinting apparatus 1 described above, the presence of a particle on the substrate 10 during the imprint processing can damage the pattern structure formed on the pattern region 8a of the mold 8.

Thus, particles on the substrate 10 should be removed before the imprinting apparatus 1 performs the imprint processing.

A method for removing particles on the substrate 10 will be described below with reference to FIGS. 2 and 3. While a process of removing particles that is performed in the imprinting apparatus 1 illustrated in FIG. 1 will be described below, the process can be performed by another particle removal apparatus different from the imprinting apparatus 1 before the imprint processing to form a pattern.

After a pattern is formed on the substrate 10 by a semiconductor process, a particle 53 may be on the surface of the substrate 10. With a finer pattern and a higher aspect ratio, it is known that the removal of the particle 53 by a conventional wet cleaning method becomes difficult, and a method of removing the particle 53 by enclosing the particle 53 in the curable composition 14 is effective.

FIGS. 2 and 3 are flowcharts illustrating a method for removing particles. Each step in the flowcharts is performed by the control unit 7 configured to comprehensively control the mechanisms of the imprinting apparatus 1 (particle removal apparatus). The steps of the flowcharts are performed by the control unit 7 by controlling the components of the imprinting apparatus 1 in FIG. 1.

In step S201, the substrate 10 is received from an external conveyor unit, and the substrate holding unit 4 holds the received substrate 10. Then, in step S202, whether a particle is on the surface of the conveyed substrate 10 is inspected. If a particle is on the surface, the number of particles and the coordinate position and the size (the size in the XY-directions and height in the Z-direction) of each particle are acquired. Any measurement method that identifies the size, height, and coordinates of a particle on the substrate 10 can be used as a particle detection method. For example, a measurement method using laser scattered light as illustrated in FIG. 4A can be used. FIG. 4E is a view illustrating the particle 53 on a shot region 10b (imprint region) of the substrate 10 in FIG. 4A as viewed from the top of the substrate 10.

A laser light beam 62 emitted from a light emitting unit 60 to the substrate 10 is reflected off the surface of the substrate 10 and enters a light detection device 61. At this time, the presence of the particle 53 on the substrate 10 changes the laser reflection state, so that the quantity of light detected by the light detection device 61 changes. Based on the change, the position (coordinate position) and size of the particle 53 are measured. Further, fine particles of known sizes, e.g., silica particles of different sizes, are spread in advance on the substrate 10 and measured using laser to thereby measure correlations between light reflection intensities and silica particle sizes. Then a calibration curve is drawn based on the correlations, whereby the size of the particle 53 is determined. Further, reflection light depends on the surface state of the substrate, which involves checking the surface state of the substrate as the measurement target in advance. The coordinates of the particle 53 on the substrate 10 are determined based on the position of the change in the reflection state. The foregoing measurement methods enable the coordinates and size of the particle 53 on the substrate 10 to be determined. Further, besides the measurement methods using laser scattered light, a method using the image capturing unit 6 as an acquisition unit can be used to acquire a coordinate position and a size. Further, an inspection result can be acquired from an external inspection apparatus without the inspection in the imprinting apparatus 1.

Steps S203 to S208 are repeated the number of times corresponding to the number of particles detected by the particle inspection in step S202.

In step S203, whether to perform the particle removal is determined. For example, if the size of the particle 53 is not a size that affects the imprint processing, it can be determined not to perform the particle removal. The particle 53 that is larger than the layer thickness of the curable composition 14 that is supplied during the imprint processing will not be buried within the curable composition 14 and may damage the mold 8, so that it is desirable to determine to perform the particle removal. Further, if the size of the particle 53 is too large to remove, it can be determined that an error occurs and the processing can be ended not to perform the subsequent imprint processing. Instead of performing the processing of determining whether to perform the particle removal as in step S203, the particles 53 can be classified according to the size without counting all the particles 53 in counting the particles 53 in the particle inspection in step S202.

In step S204, an application position (position to drop droplets) and the amount (drop amount) of the curable composition 14 to be applied to the substrate 10 for the particle removal are determined. Specifically, the positions of droplets of the curable composition 14 whose amount is determined based on the sizes of the particles 53 obtained by the inspection in step S202 and is sufficient enough to completely enclose the particles 53 are determined so that the droplets will not overflow from the end portions of the mold 8 (member) for the particle removal.

In step S205, the curable composition 14 for the particle removal is discharged from the discharge mechanism 5 to the positions determined in step S204 on the substrate 10 in the application amount determined in step S204, and the curable composition 14 is applied to the substrate 10. Consequently, the droplets of the curable composition 14 are arranged by the discharge mechanism 5 as illustrated in FIG. 4B. FIG. 4F is a view illustrating the shot region 10a of the substrate 10 in FIG. 4B as viewed from the top of the substrate 10.

The droplets of the curable composition 14 can be arranged in various patterns. For example, a square pattern 71 in FIG. 6A in which the droplets are arranged at a pitch in the shape of a square grid, a diamond pattern 72 in FIG. 6B in which the droplets are arranged at a pitch in a triangle shape, or a random pattern in FIG. 6C in which the droplets are arranged with regular spaces therebetween over a predetermined area can be used. Arrangement patterns are not limited, and any arrangement pattern with which a target thickness of the curable composition 14 can be obtained can be selected.

Further, a plurality of types of patterns can be used in combination.

In step S206, the droplets applied to the substrate 10 and the mold 8 are brought into contact with each other and pressed. Contact conditions at this time, such as a pressure and the height of the mold 8 at the time of the contact, are desirably determined based on the information acquired in step S202, such as the sizes of the particles 53. Further, the mold 8 for use in the particle removal desirably includes an adhesion layer 20 for improving the adhesion to the curable composition 14 on the surface of the mold 8, unlike a mold for use in the imprint processing. Simply the surface processing for improving the adhesion can be performed instead of providing the adhesion layer 20 if the adhesion between the mold 8 and the cured curable composition 14 becomes greater than the adhesion between the substrate 10 and the cured curable composition 14 as the result of the surface processing. For example, fine depressions and fine protrusions (surface processing layer) can be formed on the surface of the mold 8 in an attempt to improve the adhesion to the curable composition 14 by anchor effect. Further, since the mold 8 is for use in the particle removal, the surface of the mold 8 is desirably a flat surface without a pattern structure.

An application method for use in providing the adhesion layer 20 on the surface of the mold 8 is not particularly limited, and the application can be performed by an application apparatus outside the imprinting apparatus 1 or can be performed in the apparatus. For example, the application can be performed using a spin coating method or using a dipping method. In a spin coating method, the curable composition 14 is evenly applied across the entire region of the substrate 10 using a commonly used spin coating apparatus.

After the application, baking processing for curing an adhesion material can be performed. The adhesion material contains a carboxyl group, which bonds to the mold 8, and an acrylic group, which reacts with the curable composition 14, and has a function of causing the mold 8 and the curable composition 14 to adhere to each other.

After the droplets and the mold 8 are brought into contact with each other and pressed together and a sufficient time elapses, so that the curable composition 14 fills in the contact region of the mold 8, the processing proceeds to step S207, and the light exposure system 2 emits the light 9 for curing the curable composition 14 to the curable composition 14 on the substrate 10 via the mold 8 and the adhesion layer 20 to cure the curable composition 14. The curing conditions such as the quantity of emission light at this time are desirably curing conditions based on the application amount (layer thickness) of the curable composition 14 that is determined in step S204. In general, wavelengths in the ultraviolet range can mainly be used as wavelengths of the light 9. FIG. 4C is a view illustrating how the mold 8 with the adhesion layer 20 is brought into contact with the curable composition 14 enclosing the particle 53 and the curing light 9 is emitted.

In step S208, the mold 8 is separated from the cured curable composition 14 on the substrate 10. At this time, using the mold 8 provided with the adhesion layer 20 having high adhesion to the curable composition 14 causes the curable composition 14 that encloses the particle 53 and is fixed to adhere not to the substrate 10 but the mold 8 and to be separated. FIG. 4D illustrates how the mold 8 is separated from the cured curable composition 14.

After the curable composition 14 enclosing the particle 53 is separated from the substrate 10 with the mold 8, the curable composition 14 is to be removed from the mold 8. For example, a method using ozone ashing and a separation and removal method using a mixed solution of sulfuric acid and hydrogen peroxide solution can be used. Further, the mold 8 can be removed from the imprinting apparatus 1 and cleaned with a cleaning apparatus outside the imprinting apparatus 1 or can be cleaned inside the imprinting apparatus 1. The removal of the curable composition 14 from the mold 8 does not have to be performed each time the particle removal processing is performed, and the curable composition 14 can be removed collectively after the particle removal processing is performed a plurality of times. In this case, the adhesion layer 20 can be provided by applying an adhesion material to the surface of the curable composition 14 attached to the mold 8 so that the adhesion layer 20 can be used in the next particle removal processing. At this time, the mold 8 that has been used repeatedly in the particle removal processing without being cleaned is in a state where the cured curable composition 14 and the adhesion layer 20 are alternately layered on the mold 8.

The adhesion layer 20 can be applied to the surface of the curable composition 14 supplied on the substrate 10, instead of being provided on the surface of the mold 8. Specifically, the mold 8 can be brought into contact with the curable composition 14 on the substrate 10 via the adhesion layer 20 (surface processing layer) that improves the adhesion to the curable composition 14. After the release processing in step S208, the processing returns to step S203, and the particle removal processing is repeated a number of times corresponding to the number of particles detected by the particle inspection. If the particle removal processing is performed on all the particles, the particle processing ends, and the processing proceeds to step S209 to perform the imprint processing (details thereof will be described below with reference to FIG. 3). Further, after the imprint processing is completed, the substrate 10 is removed from the imprinting apparatus 1, and the process ends.

Next, cases where the application amount of the curable composition 14 that is determined in step S204 is not an optimum amount will be described with reference to FIGS. 5A-1 to 5B-4. FIGS. 5A-1 and 5A-2 chronologically illustrates a case where the amount of the applied curable composition 14 is so small for the particle 53 that the particle 53 is not completely enclosed, and FIG. 5B-1 to 5B-4 chronologically illustrates a case where an excessive amount of the applied curable composition 14 is applied for the particle 53 and sticks out from the mold 8.

In the case illustrated in FIGS. 5A-1 and 5A-2, space is formed between the curable composition 14 and the mold 8 as illustrated in FIG. 5A-1 in bringing the mold 8 into contact. The space prevents adequate adhesion between the adhesion layer 20 of the mold 8 and a portion 14-2 of the curable composition 14, and the portion 14-2 of the curable composition 14 may fail to separate from the substrate 10 and remain on the substrate 10 in releasing the mold 8 as illustrated in FIG. 5A-2.

On the other hand, in a case where an excessive amount of the curable composition 14 is applied to completely enclose the particle 53 as illustrated in FIGS. 5B-1 to 5B-4, the curable composition 14 may stick out from end portions of the mold 8 as illustrated in FIG. 5B-3 in pressing the mold 8. The light 9 for curing the curable composition 14 does not sufficiently cover the curable composition 14b sticking out from the mold 8, resulting in inadequate curing of the curable composition 14b. Being inadequately cured, the curable composition 14b is torn and remains on the substrate 10 in separating the mold 8 from the substrate 10. The curable composition 14 for particle removal that remains on the substrate 10 becomes a particle, which may cause pattern defects during the imprint processing.

Thus, an optimum application amount is an amount that is sufficient enough to completely enclose the particle 53, and the curable composition 14 is to have a sufficient thickness for the size (height) of the particle 53. Specifically, in step S204, the amount of the curable composition 14 is to be calculated based on the size (height) of the particle that is acquired in step S202. A case where the particle 53 has a size (height) of about 50 nm will be described as an example below. If the mold 8 has a size of 26 mm×33 mm and the amount of each drop of the curable composition 14 is 1.0 pL, approximately 43000 pieces of the curable composition 14 are to be arranged across the entire surface in the form of a square at a 30-µm pitch in order to completely bury the particle 53.

Further, the curable composition 14 can be prevented from sticking out from the end portions of the mold 8 by arranging the droplets of the curable composition 14 in such a manner that the position of the particle 53 is in the vicinity of the center of the mold 8 in pressing and then pressing the curable composition 14 and the mold 8 with the particle 53 at the position. Further, the spacing of the curable composition 14 near the mold 8 can be increased to prevent the curable composition 14 from sticking out. Increasing the spacing involves arranging the curable composition 14 in such a manner that the amount of space is greater in peripheral areas of the mold 8 than in the central area of the mold 8. The spacing of the curable composition 14 can be adjusted as appropriate by adjusting the pressure of the pressing of the mold 8.

Figure 7A:
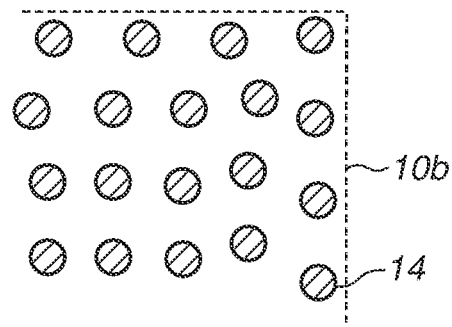
FIGS. 7A to 7C illustrate a positional relationship between droplets discharged in the particle removal processing and mesa end portions.

Specifically, as illustrated in FIG. 7A, droplets of the curable composition 14 in the shot region 10b at the end portions of the mold 8 are arranged at an increased pitch to reduce the density. The arrangement pitch in the middle of the arrangement area of the curable composition 14 is desirably changed gradually.

Figure 7B:
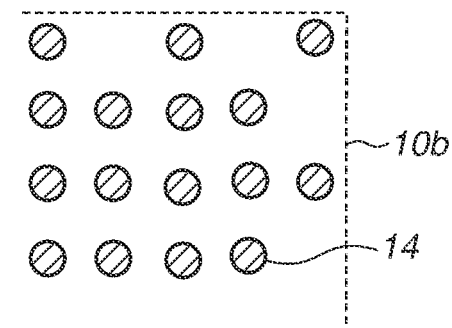
Figure 7C:
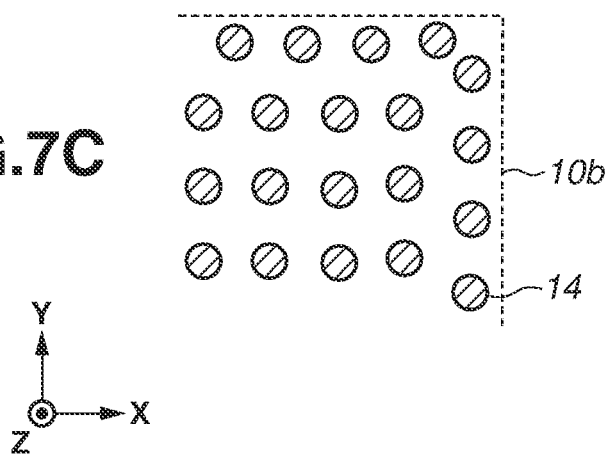

Further, droplets of the curable composition 14 can be arranged so that the amount of the curable composition 14 applied will be reduced in the shot region 10b as illustrated in FIG. 7B. Further, the arrangement pattern of droplets of the curable composition 14 in the shot region 10b can be changed from the square grid shape to a diamond shape as illustrated in FIG. 7C. As described above, the curable composition 14 is prevented from sticking out from the end portions of the mold 8 through consideration of the arrangement of droplets.

Next, the imprint processing in step S209 in FIG. 3 will be described in detail. For the particle removal processing performed in advance by a particle removal apparatus different from the imprinting apparatus 1, the substrate 10 from which the particle 53 is removed by the particle removal apparatus is prepared, and the prepared substrate 10 is installed in the imprinting apparatus 1 and the imprint processing is performed on the installed substrate 10.

The mold 8 for use in imprint processing has a desired pattern structure and does not include the adhesion layer 20 used in the particle removal processing.

In step S301, the control unit 7 controls the application of the curable composition 14 to discharge droplets from the discharge mechanism 5 in an amount suitable for the imprint processing so that the curable composition 14 will be applied onto the substrate 10. In step S302, the mold 8 and the curable composition 14 are brought into contact with each other. At this time, the pressing is desirably performed while making adjustments to fill the curable composition 14 into the structure of the pattern of depressions and protrusions of the mold 8.

In step S303, the positions of the mold 8 and the substrate 10 are adjusted by moving at least one of the mold 8 or the substrate 10 based on the misalignment between the substrate 10 and the mold 8 that is detected by the detection device 12.

In step S304, the curable composition 14 on the substrate 10 is cured by the light 9 for curing the curable composition 14 emitted to the curable composition 14 on the substrate 10 via the mold 8 by the light exposure system 2. The quantity of the light 9 that is emitted at this time is desirably a quantity corresponding to the amount of the curable composition 14 that is applied in step S301. As for the wavelength of the light 9, mainly an ultraviolet wavelength is used in general as in the particle removal processing.

In step S305, the mold 8 is released from the cured curable composition 14 on the substrate 10. At this time, since the mold 8 that does not include the adhesion layer 20 on the surface of the mold 8 is used, the curable composition 14 remains on the substrate 10, and the pattern structure is formed.

In step S306, whether there is an unprocessed shot region is determined. If there is still an unprocessed shot region (YES in step S306), the processing returns to step S301 to continue the process, whereas if the imprint processing is performed on all the shot regions (NO in step S306), the imprint processing is ended, and the processing proceeds to step S210.

As described above, the particle removal processing performed before the imprint processing separates the curable composition 14 enclosing the particle 53 so that the curable composition 14 will adhere to the mold 8, whereby the particle 53 is removed from the surface of the substrate 10. Then, after the particle 53 is removed, the imprint processing is performed, which prevents the mold 8 from being damaged by an effect of the particle 53.

In the above-described example according to the present exemplary embodiment, the mold 8 used in the particle removal processing has the same size as the mold 8 used in the imprint processing. Alternatively, the mold 8 used in the particle removal processing can be a member that is smaller in size than the mold 8 used in the imprint processing and on which the surface processing (adhesion layer) is performed to improve the adhesion to the curable composition 14 as described above. In this case, a member having an optimum size is determined (member determination processing) based on the information acquired in step S202, such as the size of the particle 35, and the particle removal processing is performed using the determined member. Further, the mold 8 for use in the particle removal processing can be in the shape of a circle or an ellipse as well as a rectangle.

Further, the curable composition 14 for use in the particle removal processing and the curable composition 14 for use in the imprint processing can be the same type of material or can be curable compositions that are of different types but are both curable by energy for curing, and a curable composition for the particle removal processing can be used.

Since the effect of post-processing does not have to be considered for a curable composition for the particle removal processing, unlike a curable composition for the imprint processing, a desired material that has no function for patterning, such as resistance to etching, can be used freely as a curable composition for the particle removal processing. Specifically, a material that is easy to apply in an amount appropriate for the size of each particle by, for example, changing the viscosity of the material as appropriate can be used.

Further, in the above-described example according to the present exemplary embodiment, the particle removal processing is performed on each particle. Alternatively, if intervals between particles are small, the particle removal processing can be performed on a plurality of particles collectively. In this case, the particle removal processing is desirably performed by determining the position and the amount of the curable composition 14 based on information about a particle having the greatest size among the particles that are to undergo the particle removal processing collectively.

A second exemplary embodiment will be described. In the above-described example according to the first exemplary embodiment, the particle removal processing is performed before the imprint processing is performed by the imprinting apparatus 1. An example will be described where the particle removal processing is performed before the planarization processing is performed by a planarization processing apparatus for planarizing depressions and protrusions on a substrate according to the present exemplary embodiment. The descriptions of similarities between the present exemplary embodiment and the first exemplary embodiment will be omitted, and mainly differences between the present exemplary embodiment and the first exemplary embodiment will be described.

The planarization processing apparatus is an apparatus that planarizes depressions and protrusions formed on a substrate during pre-processing of forming wiring layers and insulation layers using a planarization substrate having a flat contact surface.

Specifically, the curable composition 14 is collectively applied to the entire surface of the substrate 10 including a plurality of shot regions, and a planarization substrate having substantially the same size as or having a greater size than the substrate 10 is used as the mold 8 and is brought into contact with the top of the curable composition 14 for planarization. Then, with the planarization substrate in contact with the curable composition 14, the curable composition 14 is cured, and thereafter the planarization substrate is separated from the curable composition 14 on the substrate 10, whereby a planarization layer made of the cured curable composition 14 is formed on the substrate 10. Since the curable composition 14 is in contact with the planarization substrate while being cured as described above, the planarization substrate is a material that transmits curing light such as ultraviolet light. Specifically, a mold made of a material such as quartz or glass can be used. FIG. 8A illustrates a state where the mold 8 of the planarization substrate and the substrate 10 are in contact with each other.

In the planarization apparatus, a particle on the substrate 10 can damage the planarization substrate as in the first exemplary embodiment, and this may make it difficult to perform the planarization processing suitably. Thus, the particle inspection is desirably performed on the substrate 10 before the planarization processing, and the particle removal processing is desirably performed using the planarization apparatus as a particle removal apparatus. As a particle removal method, the mold 8 having a rectangular shape similar to shot regions or the mold 8 defined based on particle size as described above in the first exemplary embodiment can be used. Furthermore, the particle removal processing can be performed on the entire surface of the substrate 10 collectively using the planarization substrate for use in the planarization processing. Particles on the entire area of the substrate 10 can be removed collectively by performing the particle removal processing one time using the mold 8 of the planarization substrate that is substantially similar in size to the substrate 10 as illustrated in FIG. 8A. The processing for improving the adhesion to the curable composition 14, such as the adhesion layer 20, is also to be performed on the contact surface of the mold 8 of the planarization substrate for use in the particle removal processing. According to the present exemplary embodiment, the adhesion layer 20 can be applied to the surface of the curable composition 14 on the substrate 10 instead of being provided on the surface of the mold 8. Specifically, the mold 8 is to be in contact with the curable composition 14 on the substrate 10 via the adhesion layer 20 (surface processing layer) for improving the adhesion to the curable composition 14.

In performing the one-time removal on the entire area of the substrate 10, the position and amount of the curable composition 14 are desirably adjusted based on a particle having the greatest size among the particles detected by the particle detection. Further, use of the mold 8 of the planarization substrate having substantially the same size as the substrate 10 allows removal of particles on an edge near the outer periphery of the substrate 10.

Further, the curable composition 14 for the particle removal processing (or for the planarization processing) according to the present exemplary embodiment can be applied by discharging the curable composition 14 in droplets from the discharge mechanism 5 as in the first exemplary embodiment or can be applied to the entire area of the substrate 10 by spin coating. If the particle removal processing is to be performed using the planarization substrate, the curable composition 14 is to be applied to the entire area of the substrate 10 with which the planarization substrate is to come into contact for the following reason. Specifically, when the particle removal is performed with the curable composition 14 applied to a mere portion around a particle, the substrate 10 and the mold 8 may come into contact with each other in a region where the curable composition 14 is not applied, and the substrate 10 and/or the mold 8 may be scratched, which may cause a defect in subsequent processing.

Further, the curable composition 14 for the one-time particle removal on the entire surface of the substrate 10 is applied so as not to stick out from the outer peripheral portion of the substrate 10. FIGS. 8C-1 and C-2 illustrate an example of a state where the curable composition 14 sticks out from the outer peripheral portion of the substrate 10. If the curable composition 14 is applied to an area by the outer peripheral portion of the substrate 10 as illustrated in FIG. 8C-1, the curable composition 14 may stick out from the outer peripheral portion of the substrate 10 in bringing the mold 8 into contact with the curable composition 14 and may flow onto the back surface of the substrate 10 through the end portions of the substrate 10 as illustrated in FIG. 8C-2.

With the curable composition 14 on the back surface of the substrate 10, a chuck portion and the substrate holding unit 4 near the substrate 10 may be contaminated, and the curable composition 14 may adhere to the back surface of a subsequent substrate. With the curable composition 14 on the back surface of the substrate, the flatness of the surface of the substrate being held by the substrate holding unit 4 may be deteriorated, and positioning defects such as distortions may occur during pattern forming such as imprint processing.

Thus, to prevent the curable composition 14 from flowing onto the back surface, the thickness is adjusted to a desired thickness by adjusting the number of rotations in spin coating application and the amount of droplets to be applied to the substrate 10 during inkjet application. It is known that the thickness at this time is easily adjusted by changing the viscosity of the curable composition 14.

Further, in the spin coating method, a method of removing the curable composition 14 on the outer peripheral portion 81 of the substrate 10 (edge bead removal) can be performed as illustrated in FIG. 8B-1 after the imprint material is applied. After the edge bead removal is performed, the mold 8 of the planarization substrate is brought into contact (FIG. 8B-2), and the particle removal processing is performed, whereby the curable composition 14 is prevented from sticking out during the particle removal processing. A region from the end portion of the substrate 10 on which the edge bead removal is to be performed is desirably adjusted as appropriate based on the thickness of the curable composition 14 applied on the substrate 10.

Further, in the method of applying the curable composition 14 by spin coating, the number of times of application is not limited to one, and the curable composition 14 may be applied a plurality of times depending on the situation. If a particle detected on the substrate 10 is large in size and the thickness of the curable composition 14 applied by performing the spin coating processing one time is insufficient, the spin coating processing is performed a plurality of times, whereby the curable composition 14 in an amount that is sufficient enough to completely enclose a particle is disposed on the substrate 10.

Further, after the curable composition 14 is applied to the entire surface of the substrate 10 by spin coating, the curable composition 14 can be added as appropriate from the discharge mechanism 5 using an inkjet method. This makes it possible to increase the amount of the curable composition 14 locally at an area near a particle, whereby the curable composition 14 completely encloses the particle.

A method of making adjustments in determining the position of the curable composition 14 in step S204 in FIG. 2 to drop droplets of the curable composition 14 on the particle 53 according to a third exemplary embodiment will be described. Mainly differences between the present exemplary embodiment and the first and second exemplary embodiments will be described, and the descriptions of similarities will be omitted.

In the above-described method according to the first exemplary embodiment, the position of the particle 53 does not always coincide with the arrangement of the droplets of the curable composition 14, so that if the droplets are arranged over the particle 53 on the shot region 10b as illustrated in FIG. 9A, the droplets and the particle 53 may be different in position as illustrated in FIG. 9B. With the droplets of the curable composition 14 and the particle 53 different in position, the curable composition 14 may be pushed in an unintended direction in bringing the mold 8 into contact and may fail to enclose the particle 53 suitably. For example, if the particle 53 has an awkward shape, the curable composition 14 coming from a nearby area may fail to travel around the particle 53, and space may form between the curable composition 14 and the particle 53. With the space formed therebetween, the particle 53 is not completely fixed by the curable composition 14, so that in separating the mold 8 from the substrate 10, the particle 53 may not be separated together and remain on the substrate 10.

Thus, as illustrated in FIG. 9D, the application processing is performed to drop a droplet of the curable composition 14 directly over the particle 53, whereby the area around the particle 53 is enclosed by the curable composition 14 without space. Thus, the particle 53 can be fixed completely in the curable composition 14 by curing. In this state, the mold 8 is separated from the substrate 10, whereby the particle 53 is removed from the substrate 10.

Specifically, an arrangement pattern is determined in step S204 so that a droplet is arranged at the coordinate position of the particle 53 that is acquired in step S202 in FIG. 2, and a droplet of the curable composition 14 is arranged at the position in step S205. At this time, an arrangement position can be adjusted to shift the coordinates of a droplet 14c of the arrangement pattern as illustrated in FIG. 9C, or a droplet 14d to be dropped on the particle 53 can be added to the arrangement pattern as illustrated in FIG. 9D. When the droplet 14d to be dropped on the particle 53 is to be added, the prevention of the curable composition 14 from sticking out from the mold 8 in bringing the mold 8 into contact is to be considered in adding the droplet 14d.

A particle removal method according to a fourth exemplary embodiment different from the particle removal methods according to the first to third exemplary embodiments will be described. The descriptions of similarities between the present exemplary embodiment and the other exemplary embodiments will be omitted, and mainly differences will be described. While the curable composition 14 is supplied based on information about the particle 53 such as the size of the particle 53 in the above-described examples according to the first to third exemplary embodiments, an example will be described where a particle size is not acquired in advance according to the present exemplary embodiment.

In performing the particle removal, the inspection of whether there is a particle can be performed as in the first or second exemplary embodiment to acquire information about a particle on a substrate, or the acquisition of particle information may be skipped to improve throughput. In this case, regardless of whether the particle 53 is on the substrate 10, the curable composition 14 is desirably applied over the entire substrate 10 in an amount (thickness) that is sufficient to remove most of particles 53 that may adhere to the substrate 10, and then the particle removal processing is performed. In this case, the particle removal processing is desirably performed on the entire surface of the substrate 10 collectively using a planarization member for the planarization substrate, and an example will be described where a planarization apparatus is used as a particle removal apparatus according to the present exemplary embodiment. The substrate 10 that is a particle removal target can be a substrate for the imprint processing for forming a pattern of depressions and protrusions as in the first exemplary embodiment or can be a substrate for use in the planarization processing as in the second exemplary embodiment.

Figure 11A:
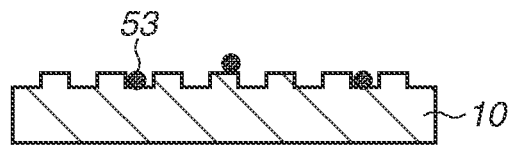
FIGS. 11A to 11D are diagrams according to an exemplary embodiment of the present disclosure.
Figure 11B:
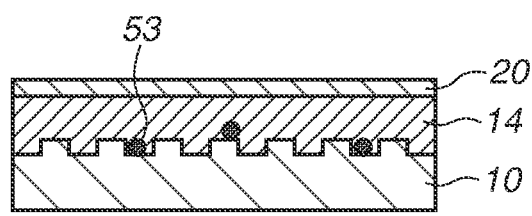

A particle removal method according to the present exemplary embodiment will be described with reference to FIGS. 11A to 11D. As illustrated in FIG. 11B, the curable composition 14 is applied over the entire surface of the substrate 10 in FIG. 11A to which the particles 53 may have adhered. As for an application method, an inkjet method of discharging droplets from the discharge mechanism 5 or a spin coating method can be used. In the inkjet method, a uniform layer of the curable composition 14 is formed using the spread of droplets by increasing the number density per unit area of droplets. In the spin coating method, the curable composition 14 is uniformly applied to the entire substrate 10 using a general spin coating apparatus. Further, the adhesion layer 20 is provided on the layer of the applied curable composition 14 by applying a material for increasing the adhesion to the surface of the mold 8 for the planarization substrate on the layer by an inkjet method or a spin coating method using a discharge mechanism (not illustrated).

Figure 11C:
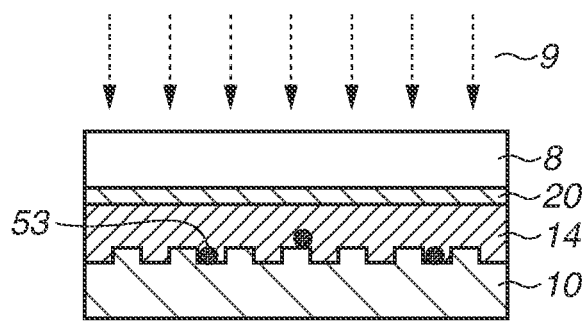

Further, as illustrated in FIG. 11C, the pressing is performed to bring the curable composition 14 and the mold 8 into contact with each other via the adhesion layer 20. Then, the light exposure system 2 emits the light 9 for curing the curable composition 14 to the curable composition 14 on the substrate 10 through the mold 8 and the adhesion layer 20 to cure the curable composition 14. Consequently, the curable layer of the curable composition 14 is cured in a state of enclosing the particles 53. The cured curable composition 14 is in a state of suitably adhering to the mold 8 via the adhesion layer 20.

Figure 11D:
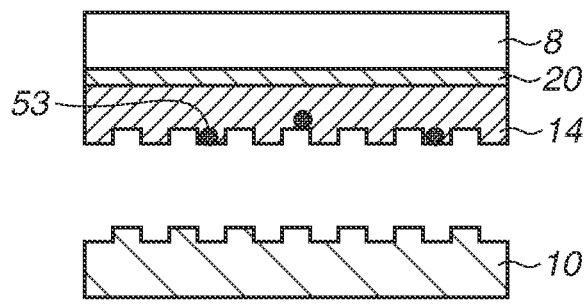

Thereafter, as illustrated in FIG. 11D, force is applied in the direction of separating the mold 8 from the substrate 10, whereby the cured curable composition 14 is separated from the surface of the substrate 10 and the particle 53 is removed from the surface of the substrate 10.

If the particle removal on the first substrate is completed, the processing proceeds to the particle removal operation on the second substrate. As illustrated in FIG. 12A, another substrate 10 with the particle 53 thereon is installed into the apparatus. At this time, the cured material layer of the curable composition 14 that is formed by the particle removal on the first substrate adheres to the surface of the mold 8. Next, as illustrated in FIG. 12B, the curable composition 14 is applied to the entire surface of the substrate 10, and thereafter the adhesion layer 20 is provided on the curable composition 14 by applying a material for increasing the adhesion to the surface of the mold 8 using a discharge mechanism (not illustrated), as in FIG. 11B.

Further, as illustrated in FIG. 12C, the pressing is performed to bring the curable composition 14 and the mold 8 into contact with each other via the adhesion layer 20. Then, the light exposure system 2 emits the light 9 for curing the curable composition 14 to the curable composition 14 on the substrate 10 through the mold 8 and the adhesion layer 20 to cure the curable composition 14. Consequently, the second curable layer (second layer) of the curable composition 14 is cured also in a state of enclosing the particles 53. The light 9 for curing the second layer of the curable composition 14 has an energy density that is adequately enough for the light 9 to reach the layer of the curable composition 14 applied in the particle removal processing on the second layer. As a result of the foregoing curing processing, the layer of the cured curable composition 14 is in a state of suitably adhering to the cured curable composition 14 on the surface of the mold 8 via the adhesion layer 20.

Thereafter, as illustrated in FIG. 12D, force is applied in the direction of separating the mold 8 from the substrate 10, whereby the cured curable composition 14 is separated from the surface of the substrate 10 and the particle 53 is removed from the surface of the substrate 10.

As described above, the same mold 8 is used for the first and second substrates without removing the previously cured curable composition 14 so that the cured curable compositions 14 can be layered, whereby the particle removal operation according to the present exemplary embodiment can be performed continuously without replacing the mold 8. This causes the layers of the curable composition 14 enclosing particles to be layered on the mold 8. After repeating the layering of the layers of the curable composition 14, however, the light 9 for curing the curable composition no longer reaches the curable composition 14, so that the mold 8 is to be replaced at an appropriate timing. The replacement can be performed before the energy for curing becomes unable to reach the curing composition 14 or can be performed every time the number of pieces reaches a predetermined number, e.g., 10. Specifically, a control unit that comprehensively controls the apparatus can be provided to notify and prompt a user to replace a member when the number of times the same member is used in the particle removal processing reaches an upper limit for curing the curable composition 14.

After the curable composition 14 enclosing the particle 53 is separated from the substrate 10, the curable composition 14 is to be removed from the mold 8. For example, a method using ozone ashing and a separation and removal method using a mixed solution of sulfuric acid and hydrogen peroxide solution can be used. Further, the mold 8 can be removed from the imprinting apparatus 1 and cleaned with a cleaning apparatus outside the imprinting apparatus 1 or can be cleaned inside the imprinting apparatus 1. Further, the mold 8 can be disposed without removing the curable composition 14.

As described above, the curable composition 14 enclosing the particle 53 is separated so that the curable composition 14 will adhere to the mold 8, whereby the particle 53 is removed from the surface of the substrate 10. Then, after the particle 53 is removed, the imprint processing or the planarization processing is performed, whereby the mold 8 is prevented from being damaged by an effect of the particle 53. Further, according to the present exemplary embodiment, the mold 8 does not have to be cleaned each time the particle removal operation is performed, so that the throughput improves. Further, the number of times the mold 8 is used is decreased, so that another advantage in terms of cost is produced.

While the adhesion layer 20 is applied to the surface of the curable composition 14 in the above-described example according to the present exemplary embodiment, the adhesion layer 20 may be applied to the surface of the mold 8 that is to be brought into contact with the curable composition 14 as in the first and second exemplary embodiments. Specifically, in the removal on the second substrate, the adhesion layer 20 is applied to the surface of the first curable composition 14 and is to be brought into contact with the second curable composition 14.

Further, while the adhesion layer 20 is provided in the above-described example according to the present exemplary embodiment, the adhesion layer 20 does not have to be provided when an adequate adhesion between the mold 8 and the curable composition 14 is achieved by the curing processing.

(Manufacture of Article)

Substrates that are manufactured by performing various types of patterning or substrate processing such as planarization processing and from which particles are removed using a particle removal method according to the first to fourth exemplary embodiments are used permanently in manufacturing at least a portion of various articles or used temporarily in manufacturing various articles. Articles are electric circuit elements, optical elements, micro-electromechanical systems (MEMS), recording elements, sensors, or molds. Examples of electric circuit elements are volatile or non-volatile semiconductor memories such as dynamic random access memories (DRAMs), static random access memories (SRAMs), flash memories, and magneto-resistive random-access memories (MRAMs), large scale integration (LSI) circuits, charge-coupled device (CCD) sensors, image sensors, and semiconductor elements such as field-programmable gate arrays (FPGAs). Examples of molds are molds for imprinting.

A pattern of a cured material is used either directly as a component member of at least part of the article or temporarily as a resist mask. The resist mask is removed after etching or ion injection is performed in substrate processing.

Figure 10A:
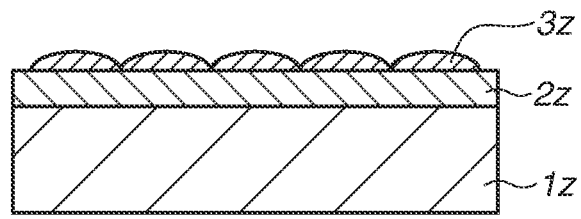
FIGS. 10A to 10F are diagrams illustrating a method for manufacturing an article.

Next, a method for manufacturing an article by forming, by an imprinting apparatus, a pattern on a substrate having undergone the particle removal, processing the substrate with the pattern formed thereon, and manufacturing an article from the processed substrate will be described with reference to FIGS. 10A to 10F. First, as illustrated in FIG. 10A, a substrate 1*z* such as a silicon wafer having a surface on which a material-to-be-processed 2*z* such as an insulator is formed is prepared, and then an imprint material 3*z* is applied to the surface of the material-to-be-processed 2*z* by an inkjet method. In FIG. 10A, the imprint material 3z in the form of a plurality of droplets applied on the substrate 1z is illustrated.

Figure 10B:
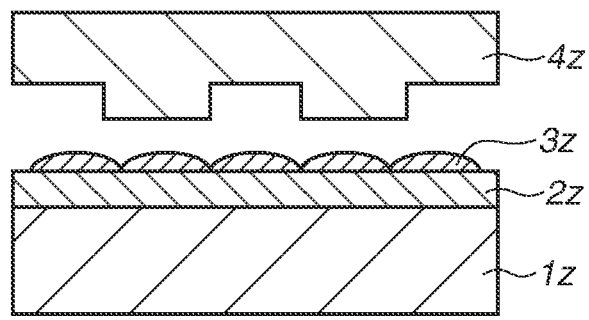
Figure 10C:
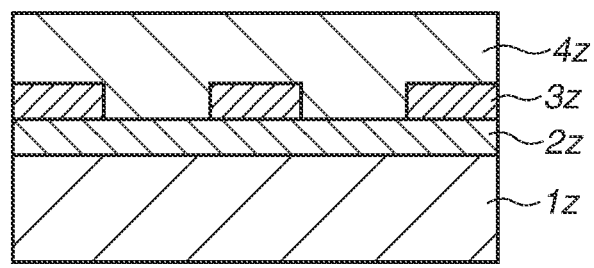

As illustrated in FIG. 10B, a mold 4z for imprinting is positioned in such a manner that the side of the mold 4z that has a pattern of depressions and protrusions formed thereon faces the imprint material 3z on the substrate 1z. As illustrated in FIG. 10C, the substrate 1z with the imprint material 3z thereon and the mold 4z are brought into contact with each other, and pressure is applied thereto. The imprint material 3z fills in the space between the mold 4z and the material-to-be-processed 2z. In this state, light as energy for curing is emitted through the mold 4z, and the imprint material 3z is cured.

Figure 10D:
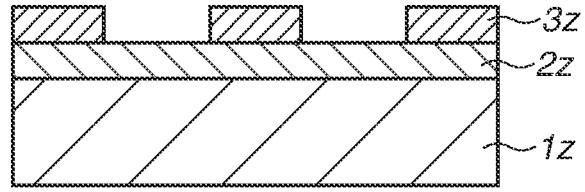

As illustrated in FIG. 10D, after the imprint material 3z is cured, the mold 4z and the substrate 1z are separated from each other, and a pattern of the cured material of the imprint material 3z is formed on the substrate 1z. The pattern of the cured material has protrusions corresponding to the depressions of the mold 4z and depressions corresponding to the protrusions of the mold 4z, i.e., the pattern of depressions and protrusions of the mold 4z is transferred to the imprint material 3z.

Figure 10E:
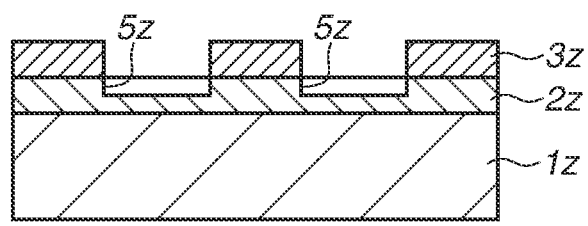
Figure 10F:
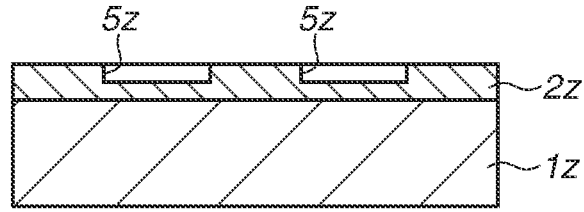

As illustrated in FIG. 10E, etching is performed using the pattern of the cured material as an etching-resistant mask, and portions of the surface of the processed material 2z on which either no cured material is present or a thin cured material remains are removed, forming trenches 5z. As illustrated in FIG. 10F, the pattern of the cured material is removed, and an article including the trenches 5z formed in the surface of the processed material 2z is obtained. While the pattern of the cured material is removed herein, the pattern can be used as, for example, an interlayer insulation film of a semiconductor element, i.e., a component member of the article, instead of being removed after the processing.

Further, the method for manufacturing an article includes forming a pattern on an imprint material supplied (applied) on a substrate using the above-described imprinting apparatus (imprint method) and processing the substrate on which the pattern is formed. Further, the manufacture method includes other known processing (oxidation, film forming, deposition, doping, planarization, etching, resist separation, dicing, bonding, packaging). The method for manufacturing an article according to the present exemplary embodiment is more advantageous than conventional methods in terms of at least one of performance, quality, productivity, or production costs of the article.

While various exemplary embodiments of the present disclosure have been described above, it is obvious that the present disclosure is not limited to the exemplary embodiments and can be modified and changed in various forms within the spirit of the disclosure.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2021-184898, filed Nov. 12, 2021, and No. 2022-099156, filed Jun. 20, 2022, which are hereby incorporated by reference herein in their entirety.

What is claimed is:

1. A particle removal method comprising:
    supplying a curable composition on a substrate;
    bringing a member into contact with the curable composition on the substrate by driving an actuator;
    curing the curable composition in a state where the curable composition and the member are in contact with each other; and
    removing the cured composition from the substrate by separating the member from the substrate,
    wherein particle processing including the supplying step, the bringing step, the curing step, and the removing step is performed a plurality of times using the same member in such a manner that the member simultaneously comprises multiple layers of removed cured composition, wherein said multiple layers are formed by multiple performances of the removing step, and
    wherein after the particle processing is performed the plurality of times, the actuator is driven to move a mold into contact with curable composition supplied onto the substrate, wherein the mold is later released from a cured layer that remains on the substrate and that was formed from curable composition.

2. The particle removal method according to claim 1, further comprising:
    acquiring information about a position and a size of a particle on the substrate; and
    determining an amount of curable composition to be supplied to the substrate based on the acquired information,
    wherein the method comprises supplying the determined amount of curable composition.

3. The particle removal method according to claim 2, further comprising determining a member for contacting curable composition based on the acquired information.

4. The particle removal method according to claim 2, wherein a curing condition for curable composition is determined based on the determined amount of curable composition.

5. The particle removal method according to claim 4, wherein supplying curable composition to the substrate involves determining an arrangement of a plurality of droplets based on the position of the particle.

6. The particle removal method according to claim 2, wherein supplying of curable composition is performed by arranging a plurality of droplets of curable composition on the substrate.

7. The particle removal method according to claim 2, wherein bringing the member into contact with curable composition on the substrate involves determining a contact condition for the member based on the acquired information and brings the member into contact.

8. The particle removal method according to claim 1, wherein bringing the member into contact with curable composition on the substrate involves bringing the member into contact with curable composition via a surface processing layer that increases adhesion.

9. The particle removal method according to claim 8, wherein an adhesion layer than increases adhesion to curable composition is formed as the surface processing layer on a surface of the member.

10. The particle removal method according to claim 8, wherein an adhesion layer that increases adhesion is formed as the surface processing layer on a surface of curable composition on the substrate.

11. The particle removal method according to claim 8, wherein a surface of the member is processed to increase adhesion to curable composition, and the surface of the member is brought into contact with curable composition.

12. A method for manufacturing an article, the method comprising:

preparing a substrate from which a particle is removed by the particle removal method according to claim 1;

performing imprint processing or planarization processing on the prepared substrate; and processing the processed substrate, wherein an article is manufactured from the processed substrate.

13. A particle removal apparatus comprising:

a first holding unit configured to hold a substrate;

a second holding unit configured to hold at least one of a member or a mold;

an actuator configured to relatively move the first holding unit and the second holding unit;

a curing unit configured to cure a curable composition on the substrate; and a control unit configured to control particle removal processing, the particle removal processing including bringing the member into contact with curable composition on the substrate by the actuator, curing the contacted curable composition by the curing unit in a state where the curable composition and the member are in contact with each other, and separating the substrate and the member from each other by the actuator so as to remove the cured composition from the substrate, wherein the control unit is configured to perform the particle removal processing a plurality of times on the substrate using the member such that the member simultaneously comprises multiple layers of cured composition formed on the member from multiple performances of the step of separating the substate and the member;

wherein the control unit is configured such that, after the particle processing is performed the plurality of times, the actuator is driven to move the mold into contact with curable composition supplied onto the substrate, wherein the mold is later released from a cured layer that remains on the substrate and that was formed from curable composition.

* * * * *